United States Patent
Ogimoto

(10) Patent No.: US 6,694,608 B2
(45) Date of Patent: Feb. 24, 2004

(54) PART MOUNTER

(75) Inventor: Shinichi Ogimoto, Ebina (JP)

(73) Assignee: Shibaura Mechatronics Corporation, Yokohama (JP)

( * ) Notice: Subject to any disclaimer, the term of this patent is extended or adjusted under 35 U.S.C. 154(b) by 54 days.

(21) Appl. No.: 09/926,157

(22) PCT Filed: Jan. 15, 2001

(86) PCT No.: PCT/JP01/00186

§ 371 (c)(1),
(2), (4) Date: Sep. 14, 2001

(87) PCT Pub. No.: WO01/52318

PCT Pub. Date: Jul. 19, 2001

(65) Prior Publication Data

US 2002/0157245 A1 Oct. 31, 2002

(30) Foreign Application Priority Data

Jan. 14, 2000 (JP) ............................................ 2000-7030

(51) Int. Cl.[7] ................................................. H05K 3/30
(52) U.S. Cl. ......................................... 29/832; 721/740
(58) Field of Search .......................... 29/743, 721, 832, 29/833, 834, 740

(56) References Cited

U.S. PATENT DOCUMENTS

| 4,393,579 A | * | 7/1983 | Van Hoorewedwer |
| 4,480,780 A | * | 11/1984 | Claeskens et al. |
| 4,796,357 A | * | 1/1989 | Smith |
| 4,868,973 A | * | 9/1989 | Fujishiro |
| 4,876,791 A | * | 10/1989 | Michand et al. |
| 4,956,911 A | * | 9/1990 | Zaremba et al. |
| 5,207,467 A | * | 5/1993 | Smith |
| 5,501,004 A | | 3/1996 | Onitsuka |
| 5,591,295 A | | 1/1997 | Onitsuka |
| 5,628,660 A | | 5/1997 | Onitsuka |

* cited by examiner

Primary Examiner—Carl J. Arbes
(74) Attorney, Agent, or Firm—Oblon, Spivak, McClelland, Maier & Neustadt, P.C.

(57) ABSTRACT

A part mounting apparatus and a part mounting method are capable of accurately mounting a plurality of film electronic parts of different types respectively having different sizes on a glass substrate. When carrying a small film electronic part having a small width by a vacuum holding mechanism (10), a cylinder actuator (16) mounted on a support plate (11) is retracted to retract a drive cam (17). Thus a movable vacuum holding block (13) is raised by springs (15) to hold the film electronic part (32a, 32b) only by a fixed vacuum holding block (12). When carrying a large film electronic part having a big width by the vacuum holding mechanism (10), the cylinder actuator (16) is stretched out to advance the drive cam (17) to its working position. Consequently, the movable vacuum block (13) is depressed through a roller (19) by the drive cam (17), and both the fixed vacuum holding block (12) and the movable vacuum holding block (13) are used for holding the film electronic part (32c, 32d) by suction.

7 Claims, 12 Drawing Sheets

|  | VACUUM SYSTEMS | | | POSITION OF MOVABLE VACUUM HOLDING BLOCK | THICKNESS OF ELECTRONIC PART |
|---|---|---|---|---|---|
|  | I | II | III | | |
| TYPE 1 | ○ | × | × | RAISED | THICK |
| TYPE 2 | ○ | ○ | ○ | LOWERED | THICK |
| TYPE 3 | ○ | ○ | ○ | LOWERED | THIN |
| TYPE 4 | ○ | × | × | RAISED | THIN |

○ : USED,  × : NOT USED

FIG. 5

| MOUNTING ORDER | TYPE |
|---|---|
| 1 | TYPE 1 |
| 2 | TYPE 1 |
| 3 | TYPE 1 |
| 4 | TYPE 1 |
| 5 | TYPE 4 |
| 6 | TYPE 4 |
| 7 | TYPE 4 |
| 8 | TYPE 4 |
| 9 | TYPE 2 |
| 10 | TYPE 2 |
| 11 | TYPE 2 |
| 12 | TYPE 3 |
| 13 | TYPE 3 |
| 14 | TYPE 3 |

FIG. 6

| | VACUUM SYSTEMS | | POSITION OF MOVABLE VACUUM HOLDING BLOCK | THICKNESS OF ELECTRONIC PART |
| --- | --- | --- | --- | --- |
| | I | II | | |
| TYPE 1 | ○ | ○ | CONTIGUOUS WITH FIXED VACUUM HOLDING BLOCK | THICK |
| TYPE 2 | ○ | ○ | APART FROM THE FIXED VACUUM HOLDING BLOCK | THICK |
| TYPE 3 | ○ | ○ | APART FROM THE FIXED VACUUM HOLDING BLOCK | THIN |
| TYPE 4 | ○ | ○ | CONTIGUOUS WITH FIXED VACUUM HOLDING BLOCK | THIN |

○ : USED, × : NOT USED

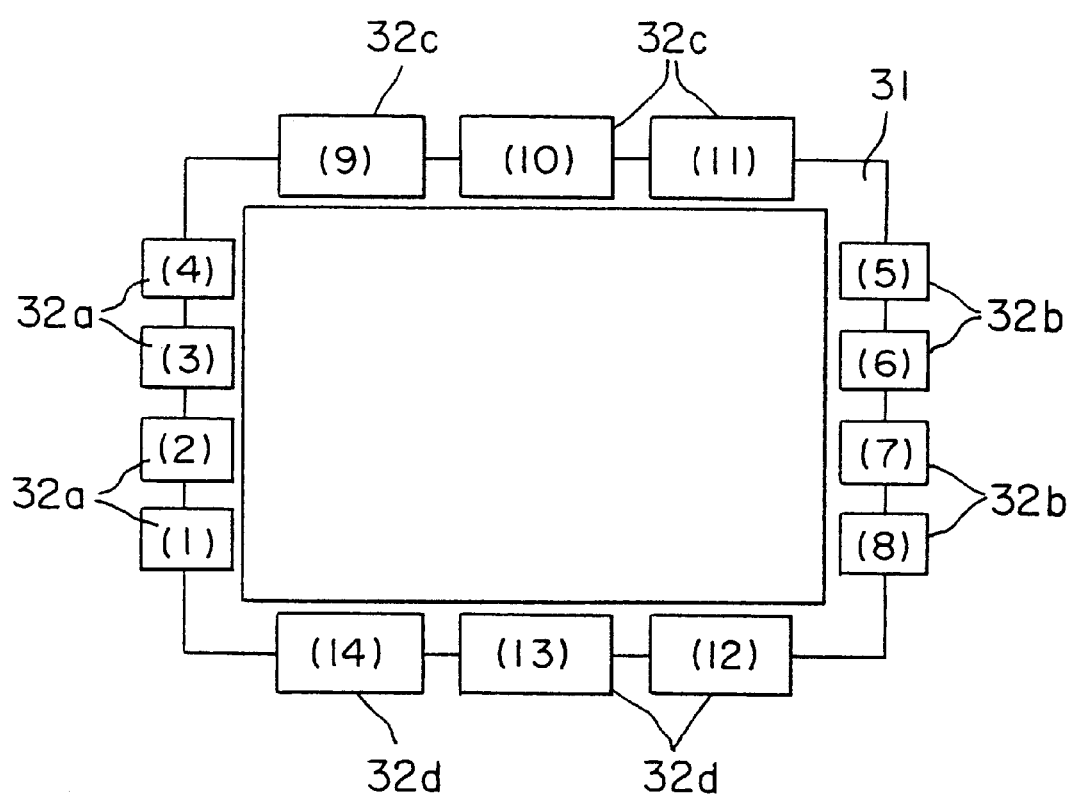
F I G. 13

PART MOUNTER

TECHNICAL FIELD

The present invention relates to a part mounting apparatus for mounting a plurality of parts of different types respectively having different dimensions on a substrate, and a part mounting method.

BACKGROUND ART

A conventional part mounting apparatus employed in fabricating a flat panel display, such as a liquid crystal display panel, mounts filmy electronic parts (hereinafter referred to as "film electronic parts") on a glass substrate.

In such a part mounting apparatus as shown in FIG. 12A (a part mounting apparatus according to the present invention), a film electronic part 32 held by a vacuum holding mechanism 10 by suction is carried by a moving mechanism, not shown, to an edge of a glass substrate 31. The glass substrate 31 and the film electronic part 32 are provided with alignment marks 33 and 34, respectively. An imaging device 35 forms an image of an image pickup region R including the alignment marks 33 and 34, and an image processor, not shown, processes an image signal provided by the imaging device 35 to recognize the respective positions of the glass substrate 31 and the film electronic part 32. The moving mechanism, not shown, corrects the position of the film electronic part 32 held by suction by the vacuum holding mechanism 10 relative to the glass substrate 31 on the basis of position data (FIG. 12B) provided by the image processor. The vacuum holding mechanism 10 presses the film electronic part 32 against the glass substrate 31, and the film electronic part 32 is bonded temporarily to the glass substrate 31 with a connecting member, such as an anisotropic conductive film, not shown. A heating and pressing unit, not shown, fastens the film electronic part 32 temporarily bonded to the glass substrate 31 permanently to the glass substrate 31.

When temporarily bonding the film electronic part 32 to the glass substrate 31, the vacuum holding mechanism 10 holding the film electronic part 32 must be operated with attention so that the vacuum holding mechanism 10 may not interfere with other film electronic parts which have been previously temporarily bonded to the glass substrate 31. If the vacuum holding mechanism 10 interferes with those film electronic parts previously temporarily bonded to the glass substrate 31, those film electronic parts are dislocated and cannot be accurately mounted on the glass substrate 31.

Therefore, it is the conventional way to take into consideration the widths of all kinds of film electronic parts 32 to be mounted on the glass substrate 31 and gaps between the adjacent film electronic parts 32 in determining the width of the vacuum holding surface of the vacuum holding mechanism 10 (hereinafter referred to as "vacuum holding width"). More concretely, the vacuum holding width of the vacuum holding mechanism 10 is determined, for example, according to the smallest one of the widths of the film electronic parts.

In recent flat panel displays, to which the present invention is related, film electronic parts 32 of many types respectively having greatly different widths, such as indicated at 32a, 32b, 32c and 32d in FIG. 13, are mounted on a glass substrate 31. If the vacuum holding width of the vacuum holding mechanism 10 is determined on the basis of the width of the smallest film electronic part, such as a film electronic part 32a in FIG. 13, as shown in FIG. 14A, side parts of a large film electronic part having a big width, such as a film electronic part 32b shown in FIG. 13, are apt to be caused to droop by their own weight as shown in FIG. 14B during transfer. When carrying a warped or wavy large film electronic part 32b, warped or wavy side parts of the film electronic part 32b cannot be straightened as shown in FIG. 14C. When an image of a film electronic part 32b having drooping side parts or warped or wavy side parts by the imaging device 35 as shown in FIG. 15, the distance Wm' between the images of the alignment marks 34 formed in opposite side parts of the film electronic part 32b is shorter than the distance Wm of the actual film electronic part 32b and, consequently, the position of the film electronic part 32b relative to the glass substrate 31 cannot be correctly adjusted.

DISCLOSURE OF THE INVENTION

The present invention has been made in view of such a problem and it is therefore an object of the present invention to provide a part mounting apparatus and a part mounting method capable of accurately mounting a plurality of film electronic parts of different types respectively having different sizes on a glass substrate.

According to a first aspect of the present invention, a part mounting apparatus for mounting an electronic part on a substrate includes a vacuum holding mechanism that holds an electronic part by suction; and a carrying mechanism that carries the electronic part held by the vacuum holding mechanism so as to press the electronic part against the substrate; wherein the vacuum holding mechanism is provided with a vacuum holding width adjusting mechanism that adjusts a vacuum holding width of the vacuum holding mechanism according to the width of the electronic part to be mounted on the substrate.

Preferably, in the part mounting apparatus in the first aspect of the present invention, the vacuum holding mechanism includes a support member, a fixed vacuum holding block fixed to the support member, and a moveable vacuum holding block that moves toward and away from the electronic part on the support member, both the fixed and the movable vacuum holding block have vacuum holding surfaces which come into contact with the electronic part, respectively, and the movable vacuum holding block is capable of being moved between a working position where the vacuum holding surface of the movable vacuum holding block is flush with the vacuum holding surface of the fixed vacuum holding block with respect to a direction along the width of the electronic part to hold the electronic part by suction, and a waiting position to which the vacuum holding surface of the movable vacuum holding block is retracted from the working position. Preferably, the vacuum holding mechanism includes a support member, a fixed vacuum holding block fixed to the support member, and a movable vacuum holding block that moves toward and away from the fixed vacuum holding block on the support member, both the fixed and the movable vacuum holding block have vacuum holding surfaces which come into contact with the electronic part, respectively, and the vacuum holding surface of the movable vacuum holding block can be positioned selectively at one of a plurality of working positions where the vacuum holding surface of the movable vacuum holding block is flush with the vacuum holding surface of the fixed vacuum holding block with respect to a direction along the width of the electronic part to hold the electronic part by suction.

Preferably, the part mounting in the first aspect of the present invention further includes a suction adjusting mechanism that adjusts the suction of at least either the fixed or the movable vacuum holding block according to the type of an electronic part to be mounted on the substrate. Preferably, the part mounting apparatus in the first aspect of the present invention includes a storage device storing electronic part mounting information, and a controller which controls the suction adjusting mechanism on the basis of the electronic part mounting information stored in the storage device.

According to a second aspect of the present invention, a part mounting method for mounting an electronic part on a substrate includes the steps of: adjusting the vacuum holding width of a vacuum holding mechanism according to the width of an electronic part; holding the electronic part by suction by the vacuum holding mechanism having an adjusted vacuum holding width; and moving the vacuum holding mechanism to press the electronic part held by suction by the vacuum holding mechanism against a substrate.

Preferably, the part mounting method in the second aspect of the present invention further includes the step of adjusting the suction of the vacuum holding mechanism according to the type of an electronic part to be mounted on the substrate.

According to the present invention, since the vacuum holding width of the vacuum holding mechanism is adjusted according to the width of a film electronic part to be mounted on a substrate, the vacuum holding mechanism does not interfere with film electronic parts previously bonded on the substrate when mounting a small film electronic part having a small width. Since the shapes of at least opposite lateral side parts of even a large electronic part having a big width are corrected when mounting the large electronic part, adverse influence of drooping, warping or waving of the film electronic part can be prevented. Thus a plurality of film electronic parts of different types respectively having different sizes can be accurately mounted on a glass substrate.

According to the present invention, an electronic part can be accurately mounted on a substrate by adjusting the suction of the vacuum holding mechanism according to the type of the electronic part to be mounted on a substrate.

BRIEF DESCRIPTION OF THE DRAWINGS

FIG. 5 is a table showing a part of electronic part mounting information (electronic part information), stored in a storage device included in the control system shown in FIG. 4;

FIG. 6 is a table showing a part of electronic part mounting information (mounting order information) stored in a storage device included in the control system shown in FIG. 4;

FIG. 13 is a schematic plan view of a flat panel display to be fabricated by using a part mounting apparatus;

BEST MODE FOR CARRYING OUT THE INVENTION

Embodiments of the present invention will be described with reference to the accompanying drawings. FIGS. 1 to 6, 11A, 11B, 12A and 12B are views of assistance in explaining a part mounting apparatus in a first embodiment of the present invention.

The general constitution of a part mounting apparatus applying the present invention will be described with reference to FIGS. 11A and 11B.

Figure 11A:
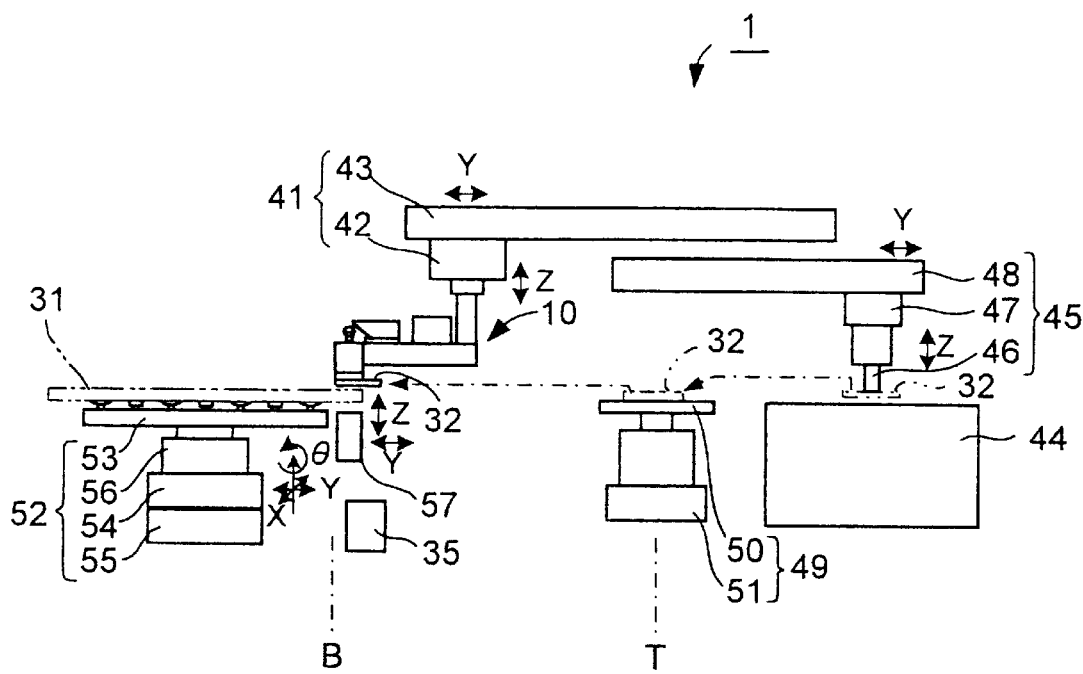
FIGS. 11A and 11B are a side elevation and a plan view, respectively, of a part mounting apparatus applying the present invention.
Figure 11B:
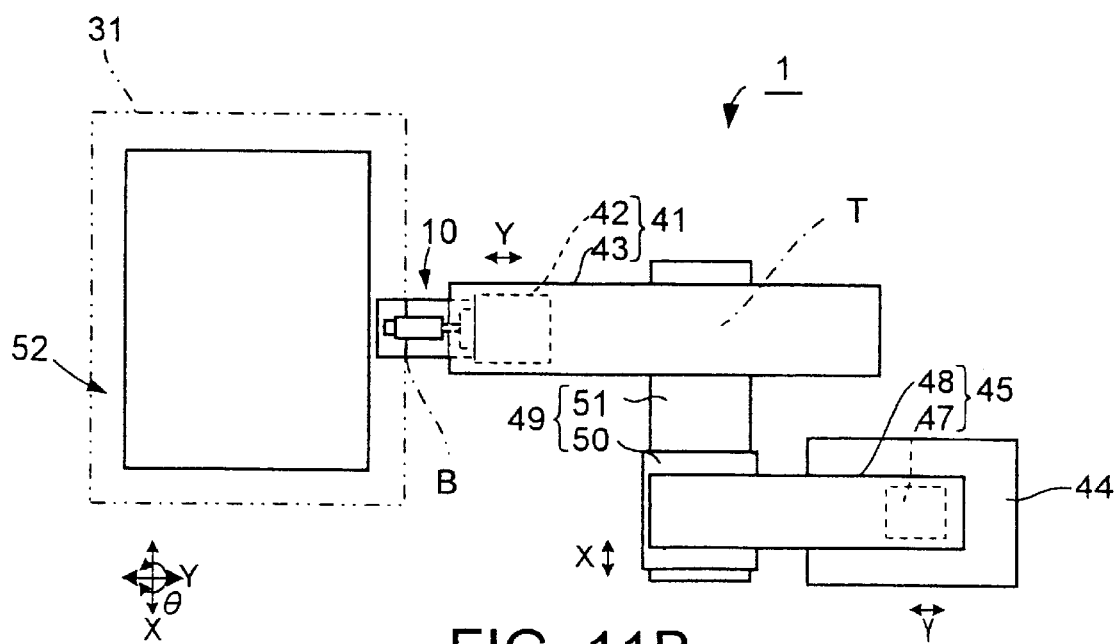

Referring to FIGS. 11A and 11B, a part mounting apparatus 1 for mounting a film electronic part 32 on a glass substrate 31 has a vacuum holding mechanism 10 for holding the film electronic part 32 by suction, and a carrying mechanism 41 for carrying the vacuum holding mechanism 10. The part mounting apparatus 1 presses the film electronic part 32 held by suction by the vacuum holding mechanism 10 against the glass substrate 31 to bond the same to the glass substrate 31. The carrying mechanism 41 has a z-axis moving unit 42 for moving the vacuum holding mechanism 10 in vertical directions (z-directions), a y-axis moving unit 43 for moving the vacuum holding mechanism 10 together with the z-axis moving unit 42 in horizontal directions (y-directions). The carrying mechanism 41 is capable of carrying the film electronic part 32 held by the vacuum holding mechanism 10 by suction from a part transfer position T to a part bonding position B on a peripheral part of the glass substrate 31.

A part feed device 44 feeds the film electronic part 32. A part transfer device 45 transfers the film electronic part 32 from the part feed device 44 to an intermediate stage 49. The part feed device 44 includes a tray, a punching mechanism and such, and is capable of feeding a plurality of film electronic parts 32 of different types respectively having different sizes, such as film electronic parts 32a, 32b, 32c and 32d shown in FIG. 13. The part transfer device 45 has a suction nozzle 46 capable of holding the film electronic part 32 by suction, a z-axis moving unit 47 for moving the suction nozzle 46 in z-directions, and a y-axis moving unit 48 for moving the suction nozzle 46 together with the z-axis moving unit 47 in y-directions. The intermediate stage 49 has a table 50 for supporting the film electronic part 32 thereon, and an x-axis moving device 51 for moving the table 50 in horizontal directions (x-directions).

The glass substrate 31 on which the film electronic parts 32 are to be mounted is supported on a substrate support stage 52. The substrate support stage 52 has a table 53, and an x-table 54, a y-table 55 and a θ-table 56 capable of moving the table 53 in x- and y-directions and turning the same in θ-directions, respectively. A backup tool 57 is disposed below the glass substrate 31 to support the glass substrate 31 thereon when the film electronic part 32 is pressed against the glass substrate 31 by the vacuum holding mechanism 10. An imaging device 35 is disposed below the glass substrate 31 to form images of the glass substrate 31 and the film electronic part 32. The backup tool 57 is moved out of the visual field of the imaging device 35 when forming images of the glass substrate 31 and the film electronic part 32 by the imaging device 35.

Figure 12A:
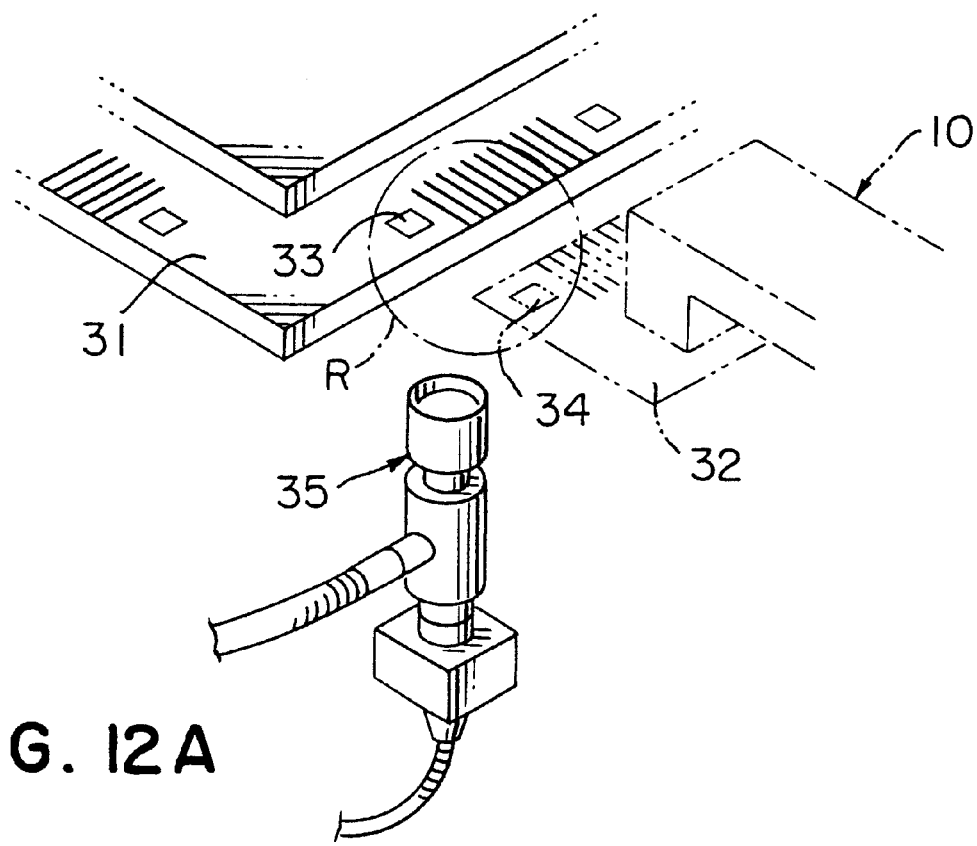
FIGS. 12A and 12B are views of assistance in explaining an operation for mounting an electronic part on a substrate by a part mounting apparatus applying the present invention.
Figure 12B:
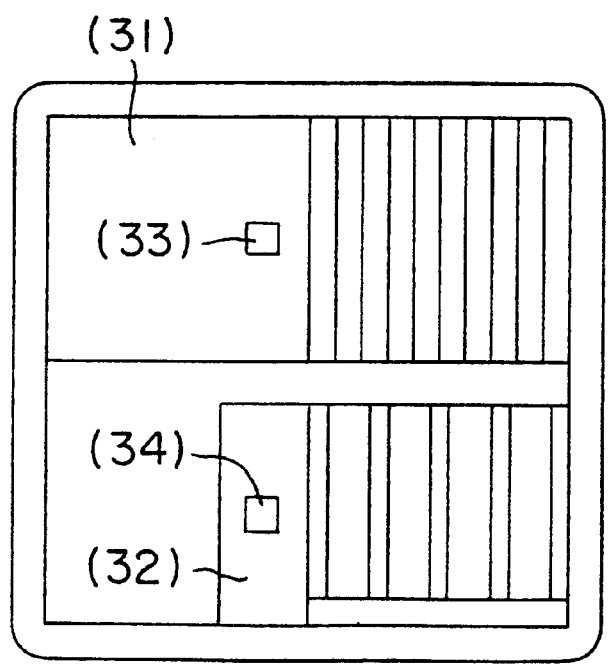
Figure 14A:
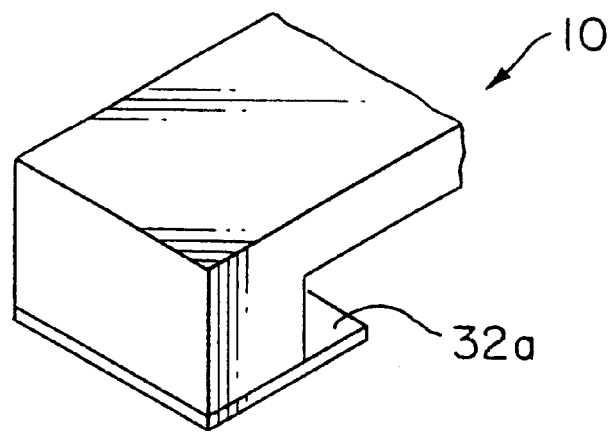
FIGS. 14A, 14B and 14C are perspective views of assistance in explaining the influence of warps and waves in electronic parts.
Figure 14B:
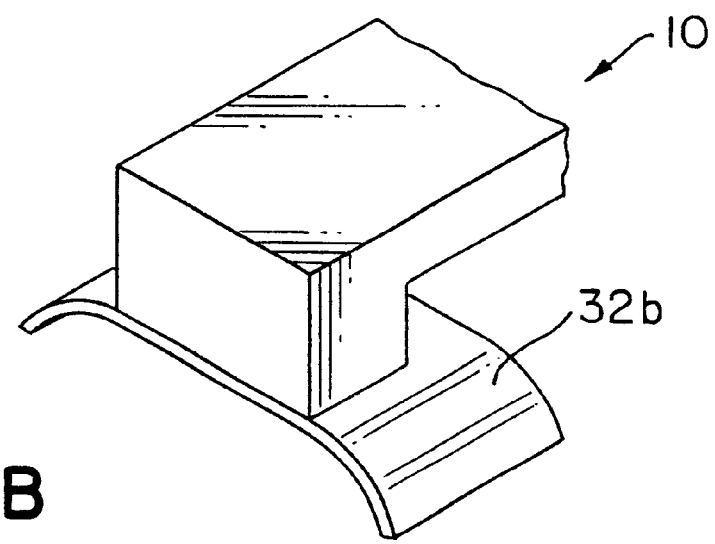
Figure 14C:
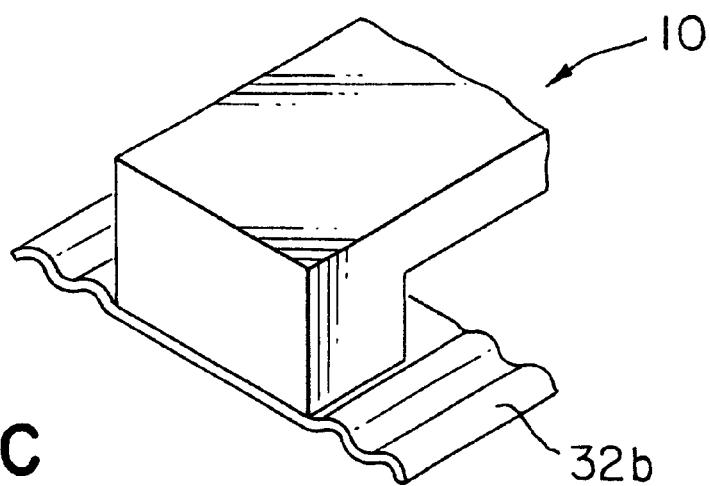
Figure 15:
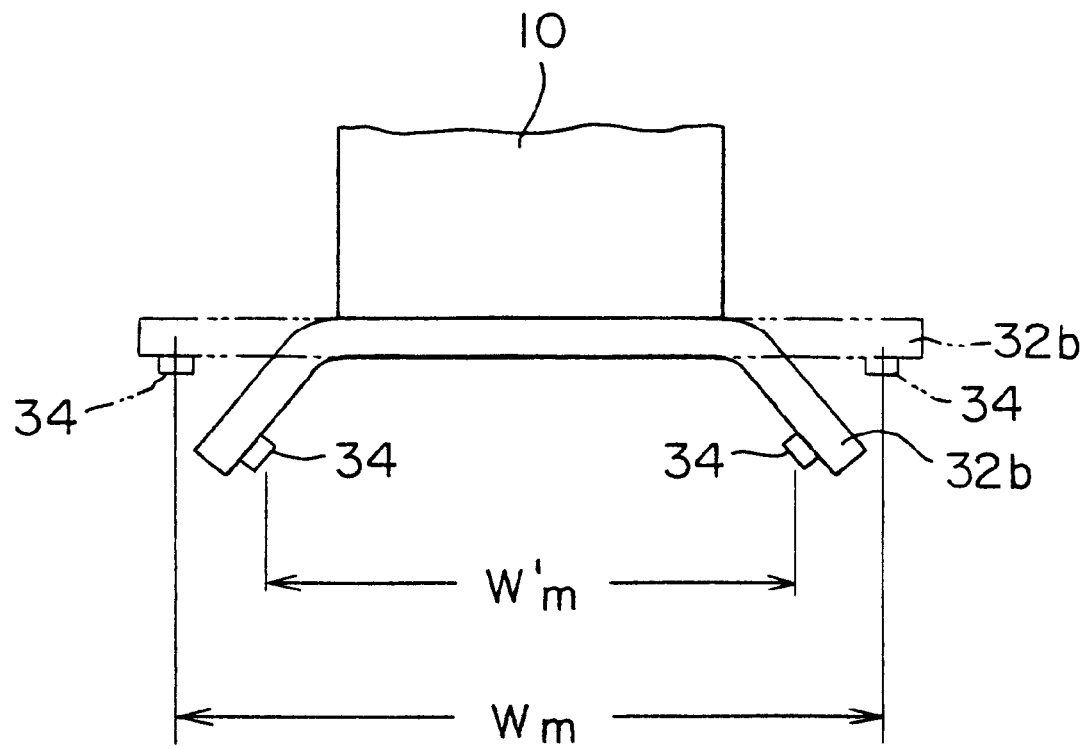
FIG. 15 is a view of assistance in explaining the influence of opposite drooping side parts of an electronic part.
Figure 15:
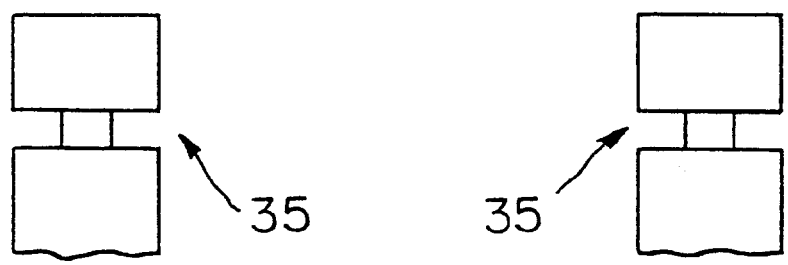

FIGS. 12A and 12B are views of assistance in explaining an operation for mounting the film electronic part 32 on the glass substrate 31 by the part mounting apparatus 1. Referring to FIGS. 12A and 12B, the glass substrate 31 and the film electronic part 32 are provided with alignment marks 33 and 34, respectively. The imaging device 35 forms an image of an image pickup region R including the alignment marks 33 and 34, and an image processor, not shown, processes an image signal provided by the imaging device 35 to recognize the respective positions of the glass substrate 31 and the film electronic part 32 (FIG. 12B).

Figure 1:
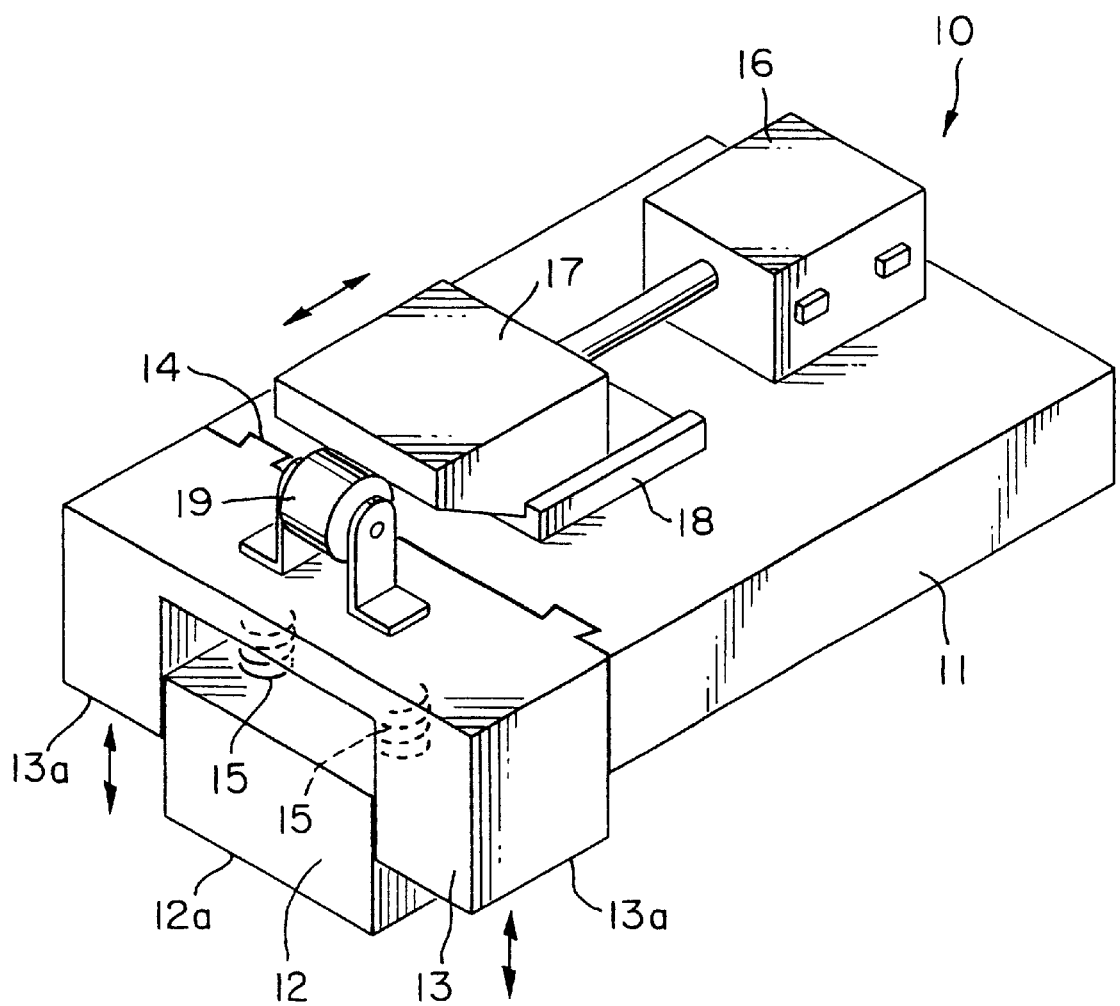
FIG. 1 is a perspective view of a vacuum holding mechanism in a first embodiment included in a part mounting apparatus of the present invention.
Figure 2A:
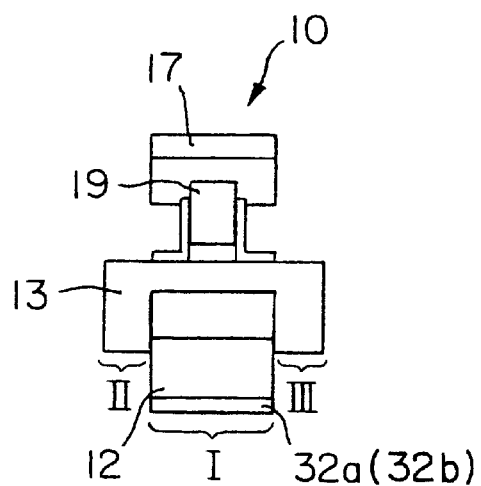
FIGS. 2A and 2B are schematic front elevation and a schematic side elevation, respectively, of the vacuum holding mechanism shown in FIG. 1 in a first state.
Figure 2B:
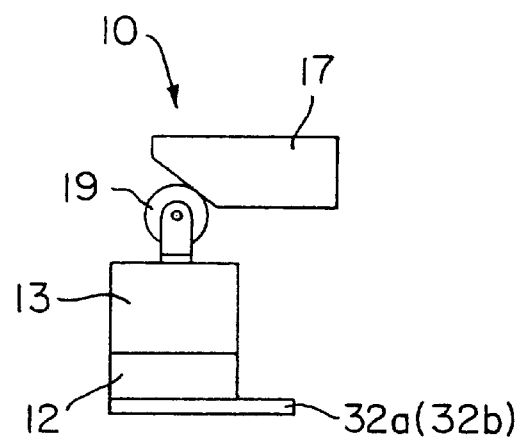
Figure 3A:
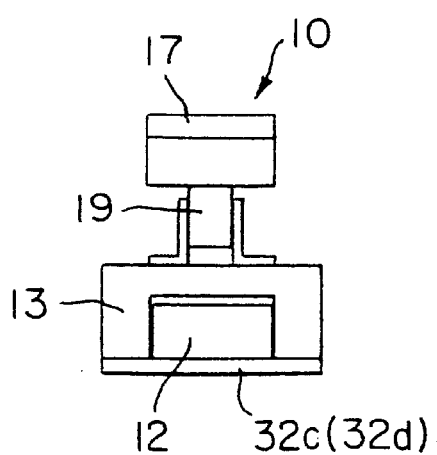
FIGS. 3A and 3B are schematic front elevation and a schematic side elevation, respectively, of the vacuum holding mechanism shown in FIG. 1 in a second state.
Figure 3B:
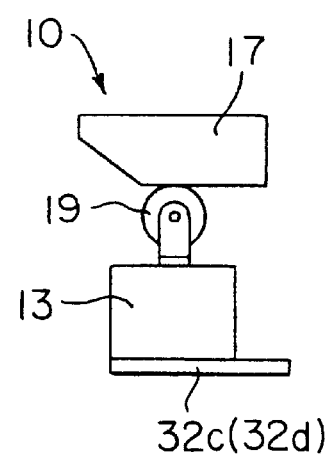

The vacuum holding mechanism 10 shown in FIGS. 11A and 11B will be described with reference to FIG. 1. Referring to FIG. 1, the vacuum holding width of the vacuum holding mechanism 10 can be adjusted according to the width of a film electronic part to be mounted on the glass substrate 31. The vacuum holding mechanism 10 has a support plate (support member) 11, a fixed vacuum holding block 12 fixed to the support plate 11, and a movable vacuum holding block 13 capable of moving toward and away from the electronic part 32 on the support plate 11, i.e. vertically moving on the support plate 11 relative to the film electronic part. The fixed vacuum holding block 12 and the movable vacuum holding block 13 have vacuum holding surfaces 12a and 13a provided with a plurality of suction holes, not shown, respectively. The movable vacuum holding block 13 is vertically movable relative to the support plate 11 along guide grooves 14 formed in the support plate 11. The movable vacuum holding block 13 is biased upward relative to the fixed vacuum holding block 12 by springs 15.

Mounted on the upper surface of the support plate 11 are a cylinder actuator 16, a drive cam 17 connected to the cylinder actuator 16 and a cam guide 18 for guiding the drive cam 17. A roller 19 is supported on the upper surface of the movable vacuum holding block 13. The cylinder actuator 16 moves the drive cam 17 along the cam guide 18 to move the movable vacuum holding block 13 vertically. Thus, the movable vacuum holding block 13 can be moved between a working position shown in FIGS. 3A and 3B for holding a film electronic part, and a waiting position shown in FIGS. 2A and 2B for waiting. When the movable vacuum holding block 13 is disposed at the working position, the vacuum holding surfaces 13a thereof are flush with the vacuum holding surface 12a of the fixed vacuum holding block 12. When the movable vacuum holding block 13 is disposed at the waiting position, the vacuum holding surfaces 13a thereof are raised relative to the vacuum holding surface 12a of the fixed vacuum holding block 12.

Figure 4:
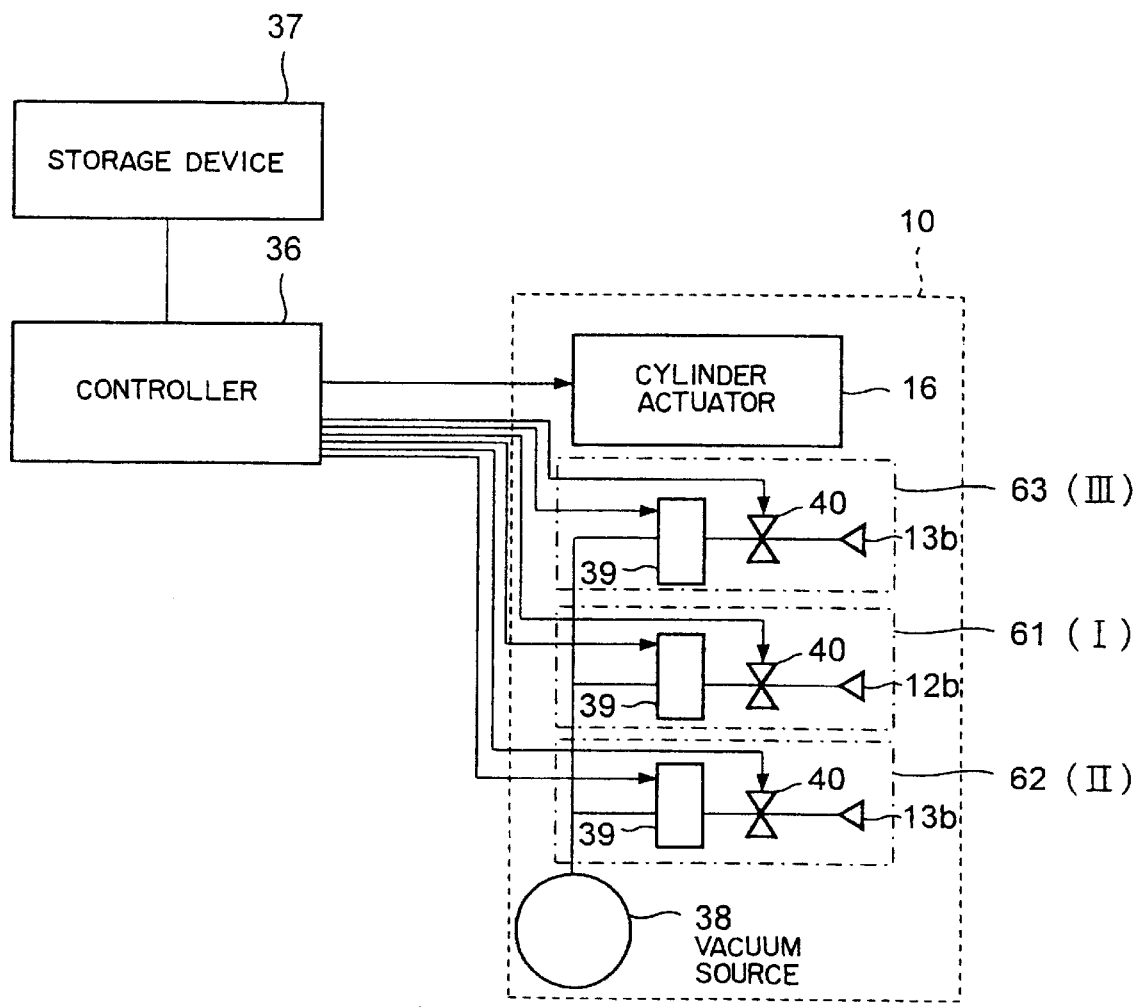
FIG. 4 is a block diagram of a control system for controlling the vacuum holding mechanism shown in FIG. 1.

The vacuum holding mechanism 10 is controlled by a controller 36 shown in FIG. 4. The cylinder actuator 16 is controlled on the basis of the width of a film electronic part. Vacuum systems 61, 62 and 63 are controlled according to the thickness of a film electronic part. The vacuum systems 61, 62 and 63 create suctions in the plurality of suction holes 12b and 13b (shown in FIG. 4) provided on the vacuum holding surfaces 12a and 13a of the fixed and movable vacuum holding blocks 12 and 13. Each of the vacuum systems 61, 62 and 63 has a pressure regulator 39 and a solenoid valve 40, and is connected to a vacuum source 38. The vacuum systems 61, 62 and 63 correspond to vacuum systems I, II and III shown in FIG. 2A, respectively. The controller 36 controls the pressure regulators 39 and the solenoid valves 40 to change suctions on the vacuum holding surfaces 12a and 13a, i.e., to create suction, to relieve suction or to adjust suction on the vacuum holding surfaces 12a and 13a. Each pressure regulator 39 and each solenoid valve 40 constitute a suction adjusting mechanism.

A storage device 37 is connected to the controller 36. The storage device 37 stores electronic part mounting information including electronic part information about film electronic parts as shown in FIG. 5 and mounting order information about order of mounting film electronic parts as shown in FIG. 6. As shown in FIG. 5, the electronic part information includes information about the vacuum systems to be used for holding the film electronic parts of different types, information about the position of the movable vacuum holding block, and information about the thicknesses of the film electronic parts of different types. As shown in FIG. 6, the mounting order information includes numbers indicating mounting order assigned to the film electronic parts of different types to be mounted on the glass substrate. The electronic part information shown in FIG. 5 and the mounting order information shown in FIG. 6 indicate an operation for mounting film electronic parts 32a, 32b, 32c and 32d in mounting order specified by parenthesized numerals shown in FIG. 13. In FIGS. 5 and 6, "Type 1", "Type 2", "Type 3" and "Type 4" indicate the film electronic parts 32a, 32c, 32d and 32b shown in FIG. 13, respectively.

The operation of the part mounting apparatus in the first embodiment will be described hereinafter.

Referring to FIGS. 11A and 11B, the part feed device 44 feeds a plurality of film electronic parts 32 of different types respectively having different sizes, such as the film electronic parts 32a, 32b, 32c and 32d shown in FIG. 13. The part transfer device 45 transfers the film electronic part 32 to the intermediate stage 49. The suction nozzle 46 of the part transfer device 45 holds the film electronic part 32 by suction and is moved in the z- and the y-direction by the z-axis moving unit 47 and the y-axis moving unit 48 to carry the film electronic part 32 onto the table 50 of the stage 49.

The x-axis moving device 51 of the intermediate stage 49 moves the table 50 in the x-direction to carry the film electronic part 32 supported on the table 50 to the part transfer position T.

The carrying mechanism 41 moves the vacuum holding mechanism 10 in the z- and the y-direction by the z-axis moving unit 42 and the y-axis moving unit 43 to locate the vacuum holding mechanism 10 at the part transfer position T. The vacuum holding mechanism 10 attracts the film electronic part 32 supported on the table 50 of the intermediate stage 49 by suction at the part transfer position T and carries the same from the part transfer position T to the part bonding position B on a peripheral part of the glass substrate 31.

The imaging device 35 forms the image pickup region R including the alignment marks 33 and 34 to locate the film electronic part 32 carried to the part bonding position B with the glass substrate 31 supported on the substrate support stage 52. An image formed by the imaging device 35 is processed by the image processing device, not shown, to recognize the positions of the glass substrate 31 and the film electronic part 32.

Subsequently, the z-axis moving device 42 and the y-axis moving device 43 are controlled on the basis of position data as shown in FIG. 12B obtained by processing the image to move the vacuum holding mechanism 10 or the table 53 is moved by the x-table 54, the y-table 55 and the θ-table 56 of the substrate support stage 52 to correct the position of the film electronic part 32 held by the vacuum holding mechanism 10 relative to the glass substrate 31.

Finally, the backup tool 57 is brought into contact with the lower surface of the glass substrate 31, the vacuum holding mechanism 10 presses the film electronic part 32 against the glass substrate 31 to bond the film electronic part 32 temporarily to the glass substrate 31 with a connecting member, not shown, such as an anisotropic conductive film. The heating and pressing unit, not shown, fastens the film electronic part 32 temporarily bonded to the glass substrate 31 permanently to the glass substrate 31.

The controller 36 shown in FIG. 4 selectively adjusts the vacuum holding width and the suction of the vacuum holding mechanism 10 according to the types of the film electronic parts 32a, 32b, 32c and 32d fed by the part feed device 44 on the basis of the electronic part mounting information (electronic part information and mounting order information) stored in the storage device 37.

The type of a film electronic part to be mounted on the glass substrate 31 by the present mounting cycle is acquired from the mounting order information shown in FIG. 6, and then, from the electronic part information shown in FIG. 5, information about the vacuum system to be used, the position of the movable vacuum holding block, and the thickness of the film electronic part specified by the mounting order information are acquired.

The vacuum holding width of the vacuum holding mechanism 10 is adjusted by changing the position of the movable vacuum holding block 13 according to the retraction and stretch of the cylinder actuator 16 on the basis of the information about the position of the movable vacuum holding block included in the acquired information. More concretely, when either of the small film electronic parts 32a and 32b (FIG. 13) having a small width is fed, the cylinder actuator 16 mounted on the support plate 11 is retracted to retract the drive cam 17 to a waiting position where the movable vacuum holding block 13 is raised by the springs 15. Consequently, the film electronic part 32a or 32b is held only by the fixed vacuum holding block 12. On the other hand, when either of the large film electronic parts 32c and 32d (FIG. 13) having a big width is fed, the cylinder actuator 16 is stretched out to move the drive cam 17 to a working position where the movable vacuum holding block 13 is depressed by the drive cam 17 and the roller 19. Consequently, the film electronic part 32c or 32d is held by both the fixed vacuum holding block 12 and the movable vacuum holding block 13.

The solenoid valves 40 of the vacuum systems 61, 62 and 63 are opened or closed on the basis of the information about the vacuum system to be used to create or relieve suction on the vacuum holding surfaces 12a and 13a.

The pressure regulators 39 of the vacuum systems 61, 62 and 63 are controlled on the basis of the information about the thickness of the film electronic part to adjust the magnitude of suction on the vacuum holding surfaces 12a and 13a.

When mounting, for example, the No. 4 film electronic part 32a indicated at (4) in FIG. 13 on the glass substrate 31, type information "Type 1" is acquired from the mounting order information shown in FIG. 6 and information about "Type 1" is acquired from the electronic part information shown in FIG. 5. Consequently, the cylinder actuator 16 is retracted to raise the movable vacuum holding block 13 to set the vacuum holding mechanism 10 in a narrow vacuum holding width. At the same time, the solenoid valve 40 of the vacuum system 61 is opened, the solenoid valves 40 of the vacuum systems 62 and 63 are closed to create suction only on the vacuum holding surface 12a. Furthermore, the pressure regulator 39 of the vacuum system 61 is controlled to adjust the suction on the vacuum holding surface 12a to a level for a film electronic part having a big thickness.

Thus, in the part mounting apparatus in the first embodiment, the movable vacuum holding block 13 combined with the fixed vacuum holding block 12 is moved vertically so as to set the same at the working position or the waiting position depending on the width of the film electronic part. Therefore, the vacuum holding mechanism 10 does not interfere with the film electronic parts previously temporarily bonded to the glass substrate 31 when bonding the small electronic parts 32a and 32b having a small width. Since the entire surface of each of the large film electronic parts 32c and 32d having a big width can be attracted to the vacuum holding surface by suction and the shapes of the large electronic parts 32c and 32d are corrected, the adverse influence of drooping, warping or waving of the film electronic parts can be prevented. Thus the plurality of film electronic parts 32a, 32b, 32c and 32d respectively having different sizes can be accurately mounted on the glass substrate 31 and hence the yield of flat panel displays, i.e., end products, can be improved.

In the part mounting apparatus in the first embodiment, suctions on the vacuum holding surfaces 12a and 13a are changed i.e., suction is created or relieved, depending on the width of the width of the film electronic part to be mounted on the glass substrate 31. Thus, the suction on the vacuum holding surfaces 13a of the movable vacuum holding block 13 can be relieved when holding the small film electronic part 32a or 32b having the small width and the vacuum created by the vacuum source 38 is used efficiently. Even if there are film electronic parts 32a and 32b temporarily bonded to the glass substrate 31 and facing the vacuum holding surfaces 13a of the movable vacuum holding block 13 when holding the small film electronic part 32a or 32b having the small width by the fixed vacuum holding block 12 and bonding the same temporarily to the glass substrate 31, the adverse action of the movable vacuum holding block 13 to attract the film electronic parts 32a and 32b previously temporarily bonded to the glass substrate 31 by suction can be prevented. Thus, the plurality of film electronic parts 32a, 32b, 32c and 32d of different types can be accurately mounted on the glass substrate 31.

The suctions on the vacuum holding surfaces 12a and 13a of the fixed vacuum holding block 12 and the movable vacuum holding block 13 are changed (adjusted) according to the thickness of a film electronic part to be mounted on the glass substrate 31 to attract the film electronic part to the vacuum holding surfaces 12a and 13a by a proper suction. Therefore, the vacuum holding surfaces 12a and 13a do not leave any marks on the film electronic part, the film electronic part can be satisfactorily prevented from drooping, warping and waving.

Although the pair of vacuum holding surfaces 13a of the movable vacuum holding block 13 are extended on the opposite sides of the vacuum holding surface 12a of the fixed vacuum holding block 12 and the movable vacuum holding block 13 having the pair of vacuum holding surfaces 13a is moved vertically in the first embodiment, a movable vacuum holding block having a single vacuum holding surface extended on one side of the vacuum holding surface 12a of the fixed vacuum holding block 12 may be employed.

Although the part mounting apparatus in the first embodiment is provided with only the single movable vacuum holding block 13, the part mounting apparatus may be provided with a plurality of movable vacuum holding blocks when two or more suction holding widths are necessary.

Second Embodiment

A part mounting apparatus in a second embodiment of the present invention will be described with reference to FIGS. 7A, 7B, 8A, 8B, 9 and 10. The part mounting apparatus in the second embodiment is substantially the same as the part mounting apparatus in the first embodiment, except that the former is provided with a vacuum holding mechanism including a support plate and a movable vacuum holding block capable of lateral movement on the support plate. Parts of the second embodiment like or corresponding to those of the first embodiment are denoted by the same reference characters and the description thereof will be omitted.

Figure 7A:
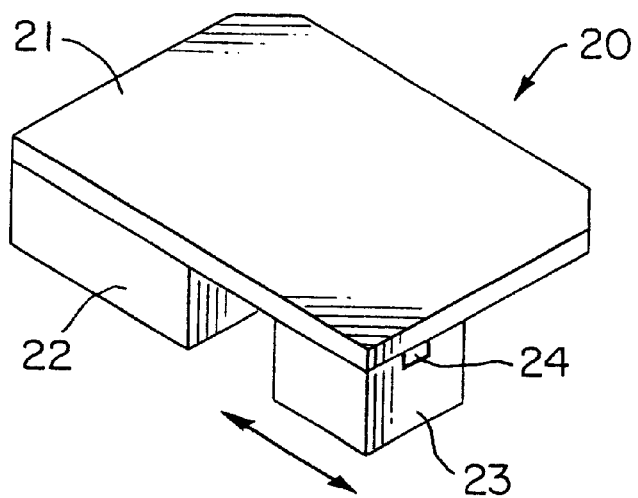
FIGS. 7A and 7B are a perspective view and a bottom view, respectively, of a vacuum holding mechanism in a second embodiment included in a part mounting apparatus of the present invention.
Figure 7B:
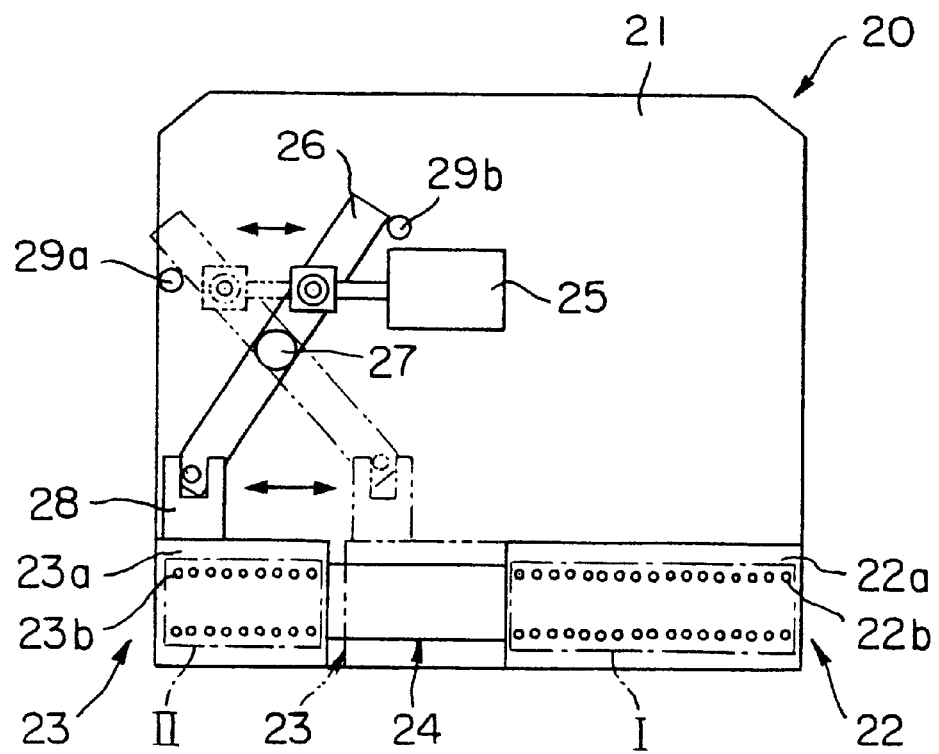
Figure 8A:
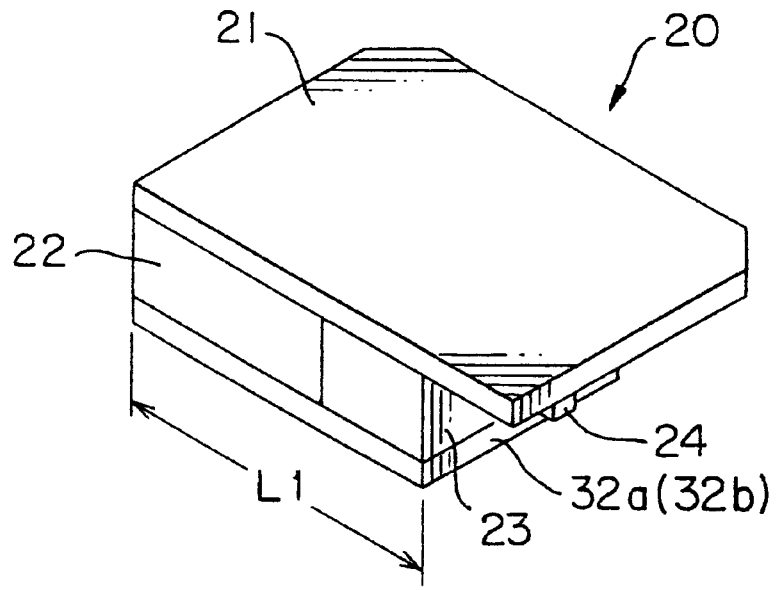
FIGS. 8A and 8B are perspective views of assistance in explaining a first state and a second state of the vacuum holding mechanism shown in FIGS. 7A and 7B.
Figure 8B:
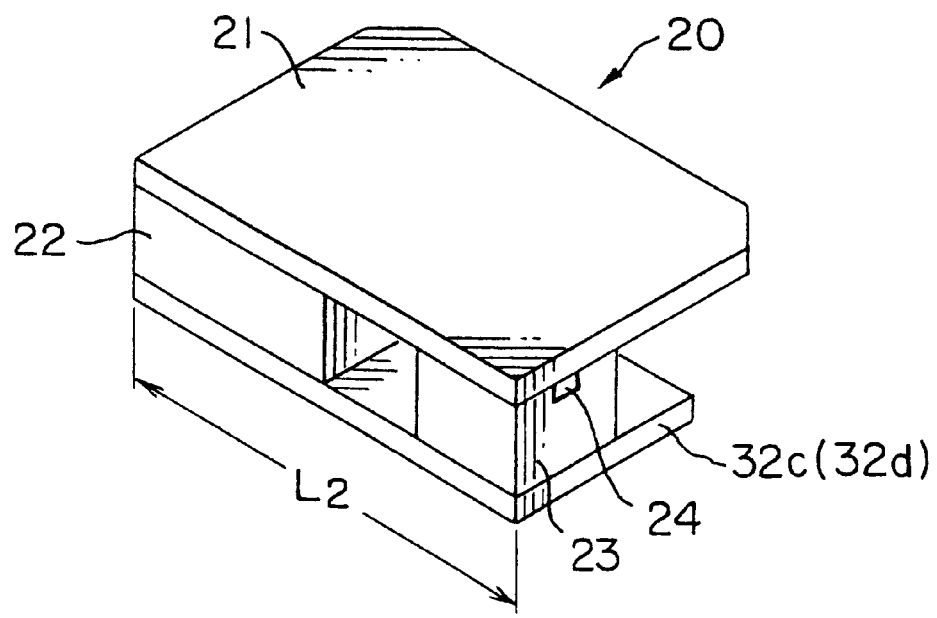

Referring to FIGS. 7A and 7B, a vacuum holding mechanism 20 included in the part mounting apparatus in the second embodiment has a support plate (support member) 21, a fixed vacuum holding block 22 fixed to the support plate 21, and a movable vacuum holding block 23 supported on the support plate 21 so as to be laterally movable toward and away from the fixed vacuum holding block 22. The fixed vacuum holding block 22 and the movable vacuum holding block 23 have vacuum holding surfaces 22a and 23a provided with suction holes 22b and 23b, respectively. The movable vacuum holding block 23 is laterally movable relative to the support plate 21 along a movable vacuum holding block guide 24 formed on the support plate 21.

As shown in FIG. 7B, a cylinder actuator 25 and a drive lever 26 connected to the cylinder actuator 25 are arranged on the lower surface of the support plate 21. The drive lever 26 is pivotally supported by a shaft 27 on the support plate 21. The drive lever 26 has one end pivotally connected to a connecting member 28 fixed to the movable vacuum holding block 23. The cylinder actuator 25 is stretched out and retracted to turn the drive lever 26 on the shaft 27. The movable vacuum holding block 23 is moved between a first working position (position indicated by imaginary lines in FIG. 7B and a position shown in FIG. 8A) where the movable vacuum block 23 is contiguous with the fixed vacuum holding block 22, and a second working position (position indicated by continuous lines in FIG. 7B and a position shown in FIG. 8B), spaced apart from the fixed vacuum holding block 22. Stoppers 29a and 29b are attached to the support plate 21 to limit the turning range of the drive lever 26. When the movable vacuum holding block 23 is set at the first working position (FIG. 8A), the vacuum holding mechanism 20 has the smallest vacuum holding width L1 corresponding to the smallest one of the widths of film electronic parts to be handled by the vacuum holding mechanism 20. When the movable vacuum holding block 23 is set at the second working position (FIG. 8B), the vacuum holding mechanism 20 has the largest vacuum holding width L2 corresponding to the width of film electronic parts having the greatest width among those to be handled by the vacuum holding mechanism 20.

Figures 9, 10:
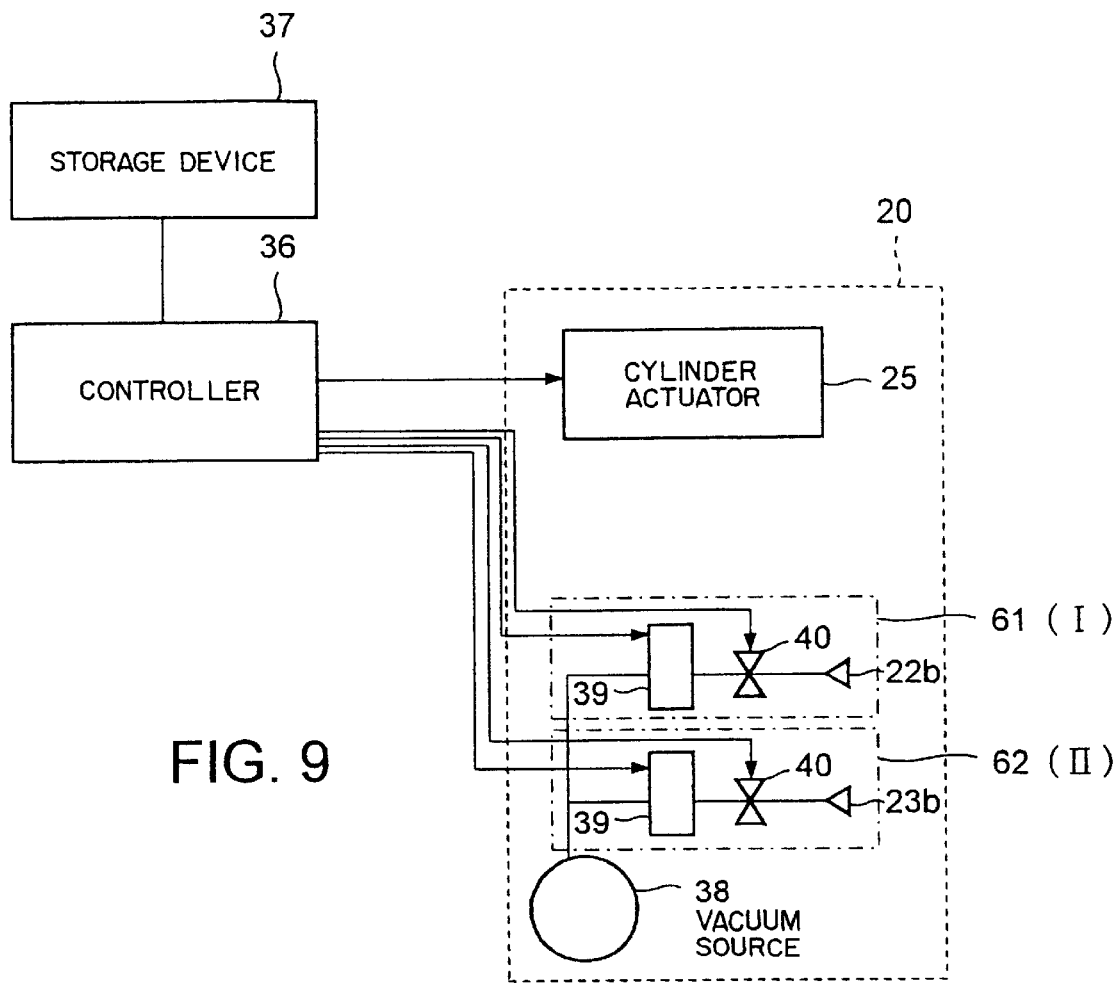
FIG. 9 is a block diagram of a control system for controlling the vacuum holding mechanism shown in FIGS. 7A and 7B.
FIG. 10 is a table showing a part of electronic part mounting information (electronic part information), stored in a storage device included in the control system shown in FIG. 9.

The vacuum holding mechanism 20 is controlled by a controller 36 shown in FIG. 9. The cylinder actuator 25 is controlled on the basis of the width of a film electronic part. Vacuum systems 61 and 62 are controlled according to the thickness of a film electronic part. The vacuum systems 61 and 62 create suctions in the plurality of suction holes 22b and 23b formed in the vacuum holding surfaces 22a and 23a. Each of the vacuum systems 61 and 62 has a pressure regulator 39 and a solenoid valve 40, and is connected to a vacuum source 38. The vacuum systems 61 and 62 correspond to vacuum systems I and II shown in FIG. 7B, respectively. The controller 36 controls the pressure regulators 39 and the solenoid valves 40 to change suctions on the vacuum holding surfaces 22a and 23a, i.e., to create suction, to relieve suction or to adjust suction on the vacuum holding surfaces 22a and 23a. Each pressure regulator 39 and each solenoid valve 40 constitute a suction adjusting mechanism.

A storage device 37 is connected to the controller 36. The storage device 37 stores electronic part mounting information including electronic part information about film electronic parts as shown in FIG. 10 and mounting order information about order of mounting film electronic parts as shown in FIG. 6. As shown in FIG. 10, the electronic part information includes information about the vacuum systems to be used for holding the film electronic parts of different types, information about the position of the movable vacuum holding block, and information about the thicknesses of the film electronic parts of different types. The mounting order information is the same as that used by the first embodiment and hence the description thereof will be omitted.

The controller 36 selectively changes the vacuum holding width and the suction of the vacuum holding mechanism 20 according to the types of the film electronic parts 32a, 32b, 32c and 32d fed by the part feed device 44 (FIGS. 11A and 11B) on the basis of the electronic part mounting information (electronic part information and mounting order information) stored in the storage device 37.

The type of a film electronic part to be mounted on the glass substrate 31 by the present mounting cycle is acquired from the mounting order information shown in FIG. 6, and then, from the electronic part information shown in FIG. 10, information about the vacuum system to be used, the position of the movable vacuum holding block, and the thickness of the film electronic part are acquired.

The vacuum holding width of the vacuum holding mechanism is adjusted by changing the position of the movable vacuum holding block 23 according to the retraction and stretch of the cylinder actuator 25 on the basis of the information about the position of the movable vacuum holding block included in the acquired information. More concretely, when either of the small film electronic parts 32a and 32b (FIG. 13) having a small width is fed, the cylinder actuator 25 mounted on the support plate 21 is stretched out to set the movable vacuum holding block 23 at the first working position (position indicated by imaginary lines in FIG. 7B). On the other hand, when either of the large film electronic parts 32c and 32d having a big width (FIG. 13) is fed, the cylinder actuator 25 is retracted to set the movable vacuum holding block 23 at the second working position (position indicated by continuous lines in FIG. 7B) spaced apart from the fixed vacuum holding block 22.

The solenoid valves 40 of the vacuum systems 61 and 62 are opened or closed on the basis of the information about the vacuum system to be used to create or relieve suction on the vacuum holding surfaces 22a and 23a.

The pressure regulators 39 of the vacuum systems 61 and 62 are controlled on the basis of the information about the thickness of the film electronic part to adjust the magnitude of suction on the vacuum holding surfaces 22a and 23a.

When mounting, for example, the No. 4 film electronic part 32a indicated at (4) in FIG. 13 on the glass substrate 31, type information "Type 1" is acquired from the mounting order information shown in FIG. 6 and information about "Type 1" is acquired from the electronic part information shown in FIG. 10. Consequently, the cylinder actuator 25 is stretched out to set the movable vacuum holding block 23 contiguously with the fixed vacuum holding block 22 so that the vacuum holding mechanism 20 is set for the small vacuum holding width. At the same time, the solenoid valves 40 of the vacuum systems 61 and 62 are opened to create suction on the vacuum holding surfaces 22a and 23a. Furthermore, the pressure regulators 39 of the vacuum systems 61 and 62 are controlled to adjust the suction on the vacuum holding surface 22a and 23a to a level for a film electronic part having a big thickness.

Thus, in the part mounting apparatus in the second embodiment, the movable vacuum holding block 23 combined with the fixed vacuum holding block 22 is moved laterally so as to set the same at the first working position or the second working position depending on the width of the film electronic part. Therefore, the vacuum holding mechanism 20 does not interfere with the film electronic parts previously temporarily bonded to the glass substrate 31 when bonding the small electronic parts 32a and 32b having a small width. Since the opposite side parts of each of the large film electronic parts 32c and 32d having a big width can be attracted to the vacuum holding surfaces by suction and the shapes of the large electronic parts 32c and 32d are corrected, the adverse influence of drooping of the opposite side parts of the film electronic parts 32c and 32d can be prevented. Thus the second embodiment, similarly to the first embodiment, is capable of accurately mounting the plurality of film electronic parts 32a, 32b, 32c and 32d (FIG. 12) respectively having different sizes on the glass substrate 31 and of improving the yield of flat panel displays, i.e., end products.

Although the movable vacuum holding block 23 is set at the first working position so as to be contiguous with the fixed vacuum holding block 22 to set the vacuum holding mechanism 20 in the vacuum holding width L1 corresponding to the smallest one of the widths of the film electronic part to be mounted on the glass substrate in the second embodiment, the fixed vacuum holding block 22 may have the smallest vacuum holding width L1 corresponding to the smallest one of the widths of the film electronic parts, in a case where the movable vacuum holding block 23 does not interfere with film electronic parts previously temporarily bonded to the glass substrate even if only the fixed vacuum holding block 22 is used for temporarily bonding film electronic parts to the glass substrate, such as a case where film electronic parts are spaced sufficiently big intervals apart from each other on the glass substrate or the movable vacuum holding block 23 is always on the side of a region in which any film electronic parts have not yet been arranged. In such a case, it is preferable that the vacuum holding width L1 is equal to a width between the smallest and the biggest one of the widths of the film electronic parts, and the vacuum holding width L2 is equal to the biggest one of the widths of the film electronic parts.

Although the first and the second embodiment use the electronic part information including the information about vacuum systems to be used, information about the position of the movable vacuum holding block, and information about the thickness of film electronic parts, information that can be used by the present invention is not limited thereto. The information to be used by present invention may include other information, such as information about the stiffness (resistance to bending) of film electronic parts. The suction in the suction holes may be increased if the thin film electronic part is stiff.

What is claimed is:

1. A part mounting apparatus for mounting a flexible electronic part, which is apt to droop under its own weight, on a substrate, said part mounting apparatus comprising:

a vacuum holding mechanism adapted to hold the electronic part by suction; and a carrying mechanism adapted to carry the electronic part held by the vacuum holding mechanism so as to press the electronic part against the substrate;

wherein the vacuum holding mechanism is provided with a vacuum holding width adjusting mechanism adapted to adjust a vacuum holding width of the vacuum holding mechanism according to a width of the electronic part.

2. The part mounting apparatus according to claim 1, wherein the vacuum holding mechanism includes a support member, a fixed vacuum holding block fixed to the support member, and a movable vacuum holding block adapted to move toward and away from the electronic part on the support member, both the fixed and the movable vacuum holding block have vacuum holding surfaces which are adapted to come into contact with the electronic part, and the movable vacuum holding block is capable of being moved between a working position where the vacuum holding surface of the movable vacuum holding block is flush with the vacuum holding surface of the fixed vacuum holding block with respect to a direction along the width of the electronic part to hold the electronic part by suction, and a waiting position to which the vacuum holding surface of the movable vacuum holding block is retracted from the working position.

3. The part mounting apparatus according to claim 1, wherein the vacuum holding mechanism includes a support member, a fixed vacuum holding block fixed to the support member, and a movable vacuum holding block adapted to move toward and away from the fixed vacuum holding block on the support member, both the fixed and the movable vacuum holding block have vacuum holding surfaces which are adapted to come into contact with the electronic part, and the vacuum holding surface of the movable vacuum holding block can be positioned selectively at one of a plurality of working positions where the vacuum holding surface of the movable vacuum holding block is flush with the vacuum holding surface of the fixed vacuum holding block with respect to a direction along the width of the electronic part to hold the electronic part by suction.

4. The part mounting apparatus according to claim 2 or 3, further comprising a suction adjusting mechanism adapted to adjust a suction of at least either the fixed or the movable vacuum holding block according to a type of the electronic part.

5. The part mounting apparatus according to claim 4, further comprising:

a storage device adapted to store electronic part mounting information, and a controller adapted to control the suction adjusting mechanism on a basis of the electronic part mounting information stored in the storage device.

6. A part mounting method for mounting a flexible electronic part, which is apt to droop under its own weight, on a substrate, said part mounting method comprising the steps of:

adjusting a vacuum holding width of a vacuum holding mechanism according to a width of the electronic part;

holding the electronic part by suction by the vacuum holding mechanism having an adjusted vacuum holding width; and moving the vacuum holding mechanism to press the electronic part held by suction by the vacuum holding mechanism against the substrate.

7. The part mounting method according to claim 6, further comprising adjusting suction of the vacuum holding mechanism according to a type of the electronic part.

* * * * *